US012690294B2

(12) United States Patent
Fang et al.

(10) Patent No.: US 12,690,294 B2
(45) Date of Patent: Jul. 21, 2026

(54) EPITAXIAL STRUCTURE AND METHOD FOR FORMING THE SAME

(71) Applicant: PlayNitride Display Co., Ltd., MiaoLi County (TW)

(72) Inventors: Hsin-Chiao Fang, MiaoLi County (TW); Shen-Jie Wang, MiaoLi County (TW); Yen-Lin Lai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 605 days.

(21) Appl. No.: 17/989,700

(22) Filed: Nov. 18, 2022

(65) Prior Publication Data

US 2024/0128397 A1      Apr. 18, 2024

(30) Foreign Application Priority Data

Oct. 12, 2022   (TW) .................................. 111138536
Oct. 12, 2022   (TW) .................................. 111138555

(51) Int. Cl.
*H10H 20/01*        (2025.01)
*H10H 20/812*       (2025.01)
(Continued)

(52) U.S. Cl.
CPC ........ *H10H 20/013* (2025.01); *H10H 20/812* (2025.01); *H10H 20/824* (2025.01); *H10H 20/83* (2025.01)

(58) Field of Classification Search
None
See application file for complete search history.

(56) References Cited

U.S. PATENT DOCUMENTS 5,419,785 A       5/1995   Twigg et al.
2009/0140273 A1*  6/2009   Takeuchi ............... B82Y 20/00
                                             257/E29.089
(Continued)

FOREIGN PATENT DOCUMENTS

CN        105322063       2/2016
CN        107851689       3/2018
(Continued)

OTHER PUBLICATIONS

Light Emitting Semiconductor Device; Chao Hsun Wang et al., 2014 (Year: 2014).*
(Continued)

*Primary Examiner* — Nilufa Rahim
(74) *Attorney, Agent, or Firm* — JCIPRNET

(57)      ABSTRACT

An epitaxial structure including a first epitaxial layer, a second epitaxial layer, and an interface treatment layer is provided. The first epitaxial layer is an ohmic contact layer. The second epitaxial layer is disposed on the first epitaxial layer and is a phosphide compound layer, where a material of the second epitaxial layer is different from a material of the first epitaxial layer. The interface treatment layer contacts the first epitaxial layer and the second epitaxial layer and is located between the first epitaxial layer and the second epitaxial layer. An image contrast ratio of a transmission electron microscope (TEM) of the interface treatment layer to the first epitaxial layer and an image contrast ratio of the TEM of the interface treatment layer to the second epitaxial layer are both greater than 1.005. A method for forming an epitaxial structure is also provided.

19 Claims, 5 Drawing Sheets

100a

(51) Int. Cl.
H10H 20/824       (2025.01)
H10H 20/83        (2025.01)

(56)                    References Cited

U.S. PATENT DOCUMENTS

| | | | |
|---|---|---|---|
| 2017/0098731 A1 | 4/2017 | Shatalov et al. | |
| 2017/0373220 A1 | 12/2017 | Eichler et al. | |
| 2020/0212261 A1 | 7/2020 | Lee et al. | |
| 2022/0393088 A1 | 12/2022 | Kwon et al. | |
| 2023/0076489 A1* | 3/2023 | Gao | H10H 20/816 |
| 2024/0274751 A1* | 8/2024 | Kim | H10H 20/824 |

FOREIGN PATENT DOCUMENTS

| | | |
|---|---|---|
| CN | 109817777 | 5/2019 |
| CN | 114447165 | 5/2022 |
| JP | 2000022211 A | 1/2000 |
| TW | 202025513 | 7/2020 |

OTHER PUBLICATIONS

"Office Action of Taiwan Counterpart Application, Application No. 111138555", issued on May 30, 2023, p. 1-p. 5.

"Office Action of Taiwan Counterpart Application", issued on Aug. 10, 2023, p. 1-p. 6.

"Office Action of China counterpart Application, Application No. 202211249958.5", issued on Dec. 8, 2025, p. 1-p. 8.

"Office Action of China Counterpart Application, Application No. 202211249960.2", issued on Jul. 4, 2025, p. 1-p. 11.

"Office Action of Related U.S. Appl. No. 17/994,016", issued on Feb. 26, 2026, p. 1-p. 20.

* cited by examiner 230
220
210
190
180
120
130
110
150
140
170
160

100

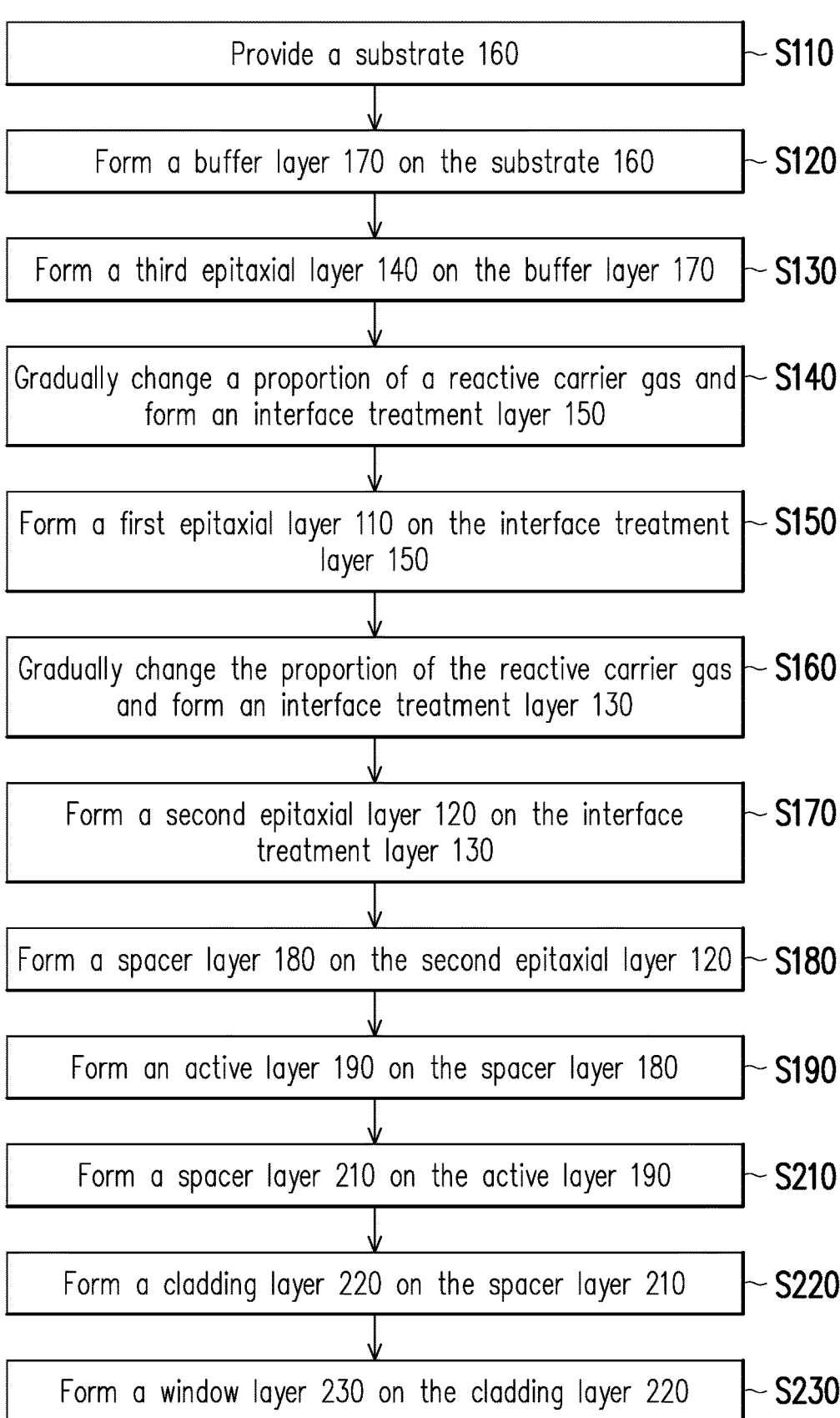

Provide a substrate 160 — S110

Form a buffer layer 170 on the substrate 160 — S120

Form a third epitaxial layer 140 on the buffer layer 170 — S130

Gradually change a proportion of a reactive carrier gas and form an interface treatment layer 150 — S140

Form a first epitaxial layer 110 on the interface treatment layer 150 — S150

Gradually change the proportion of the reactive carrier gas and form an interface treatment layer 130 — S160

Form a second epitaxial layer 120 on the interface treatment layer 130 — S170

Form a spacer layer 180 on the second epitaxial layer 120 — S180

Form an active layer 190 on the spacer layer 180 — S190

Form a spacer layer 210 on the active layer 190 — S210

Form a cladding layer 220 on the spacer layer 210 — S220

Form a window layer 230 on the cladding layer 220 — S230

EPITAXIAL STRUCTURE AND METHOD FOR FORMING THE SAME

CROSS-REFERENCE TO RELATED APPLICATION

This application claims the priority benefit of Taiwan application serial no. 111138536, filed on Oct. 12, 2022 and Taiwan application serial no. 111138555, filed on Oct. 12, 2022. The entirety of each of the above-mentioned patent applications is hereby incorporated by reference herein and made a part of this specification.

BACKGROUND

Technical Field

The disclosure relates to an epitaxial structure and a method for forming the same.

Description of Related Art

Semiconductor epitaxial technologies may be applied to fabricate various photoelectronic elements, such as light emitting diodes (LEDs), laser diodes, photodiodes, and the like. The semiconductor epitaxial technologies include chemical vapor deposition (CVD), physical vapor deposition (PVD), and so on, where the CVD technology further includes metal organic chemical vapor deposition (MOCVD), which is a common epitaxial process.

Semiconductor elements or photoelectronic elements usually have a plurality of film layers made of different materials. When a film layer of another material is formed in the epitaxial process, it is usually necessary to turn off unnecessary gases. If these gases are turned off at the same time, the wafer is being baked at a high temperature in a reactive chamber, thus resulting in deterioration of epitaxial quality.

Therefore, how to prevent the deterioration of the epitaxial quality resulting from the change of the material of the film layer in the epitaxial process is an issue that those skilled in the art are eager to tackle.

SUMMARY

The disclosure provides an epitaxial structure with a favorable epitaxial quality.

The disclosure provides a method for forming an epitaxial structure, whereby an epitaxial structure with a favorable epitaxial quality may be formed.

In an embodiment of the disclosure, an epitaxial structure including a first epitaxial layer, a second epitaxial layer, and an interface treatment layer is provided. The first epitaxial layer is an ohmic contact layer. The second epitaxial layer is disposed on the first epitaxial layer and is a phosphide compound layer, where a material of the second epitaxial layer is different from a material of the first epitaxial layer. The interface treatment layer contacts the first epitaxial layer and the second epitaxial layer and is located between the first epitaxial layer and the second epitaxial layer, where an image contrast ratio of a transmission electron microscope (TEM) of the interface treatment layer to the first epitaxial layer and an image contrast ratio of the TEM of the interface treatment layer to the second epitaxial layer are both greater than 1.005.

In another embodiment of the disclosure, a method for forming an epitaxial structure is provided, and the method includes following steps. A first epitaxial layer is formed, and the first epitaxial layer is an ohmic contact layer. A proportion of a reactive carrier gas is gradually changed, and an interface treatment layer is formed. A second epitaxial layer is formed on the interface treatment layer, where the second epitaxial layer is a phosphide compound layer, and a material of the second epitaxial layer is different from a material of the first epitaxial layer.

In the epitaxial structure provided in one or more embodiments of the disclosure, the interface treatment layer is arranged between the first epitaxial layer and the second epitaxial layer, and the image contrast ratio of the TEM of the interface treatment layer to the first epitaxial layer and the image contrast ratio of the TEM of the interface treatment layer to the second epitaxial layer are both greater than 1.005. Hence, the favorable epitaxial quality of the epitaxial structure may be guaranteed. Besides, in the method for forming the epitaxial structure provided in one or more embodiments of the disclosure, the interface treatment layer is formed by gradually changing the proportion of the reactive carrier gas. Compared to the conventional epitaxial process where the unnecessary gases are turned off at the same time, which causes the wafer to be baked at the high temperature in the reactive chamber and thus leads to the deterioration of the epitaxial quality, the method for forming the epitaxial structure provided herein is performed by gradually changing the proportion of the reactive carrier gas, so that the resultant epitaxial structure may have a favorable epitaxial quality.

In order to make the above-mentioned features and advantages of the disclosure easier to understand, the following specific embodiments are given and described in details with the accompanying drawings as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4 is a flowchart of a method for forming an epitaxial structure according to an embodiment of the disclosure.

DESCRIPTION OF THE EMBODIMENTS

Figure 1:
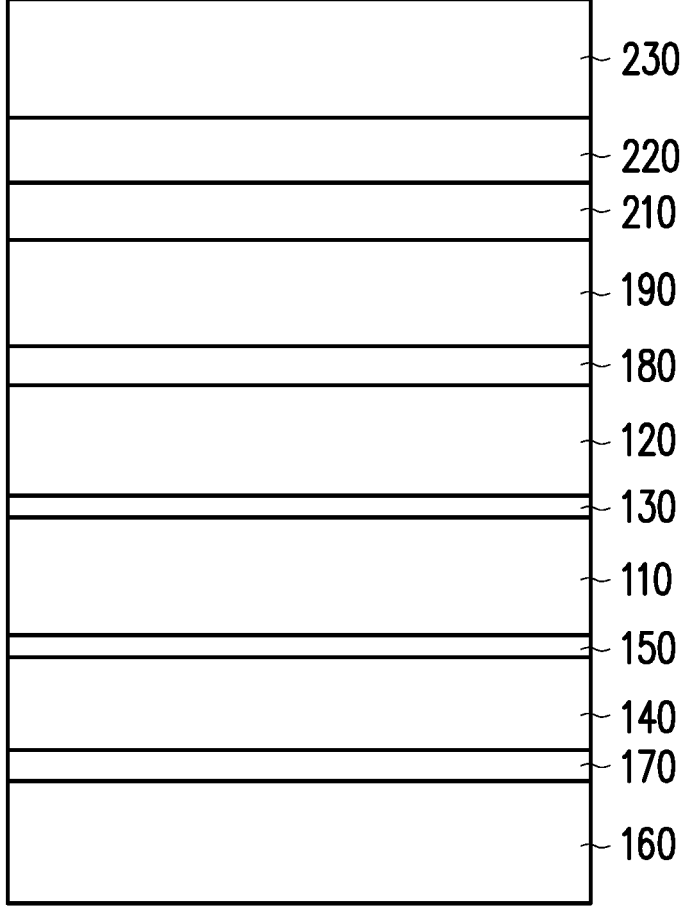
FIG. 1 is a schematic cross-sectional diagram of an epitaxial structure according to an embodiment of the disclosure.

Reference is now made in detail to exemplary embodiments of the disclosure, and examples of the exemplary embodiments are described in the accompanying drawings. Whenever possible, the same reference numbers are used in the drawings and descriptions to indicate the same or similar parts.

FIG. 1 is a schematic cross-sectional diagram of an epitaxial structure according to an embodiment of the disclosure. With reference to FIG. 1, an epitaxial structure 100 provided in this embodiment includes a first epitaxial layer 110, a second epitaxial layer 120, and an interface treatment layer 130. The first epitaxial layer 110 is an ohmic contact layer. The second epitaxial layer 120 is disposed on the first epitaxial layer 110 and is a phosphide compound layer, where a material of the second epitaxial layer 120 is different from a material of the first epitaxial layer 110. In this embodiment, the material of the first epitaxial layer 110 includes gallium arsenide (GaAs), for instance, and the chemical formula of the second epitaxial layer 120 is, for instance, $(Al_xGa_{1-x})_yIn_{1-y}As_zP_{1-z}$, where $0 \leq x \leq 1$, $0 \leq y \leq 1$, and $0 \leq z < 1$. In an embodiment of the disclosure, the material of the second epitaxial layer 120 includes aluminum gallium indium phosphide (AlGaInP), for instance, which should however not be construed as a limitation in the disclosure.

Figure 2:
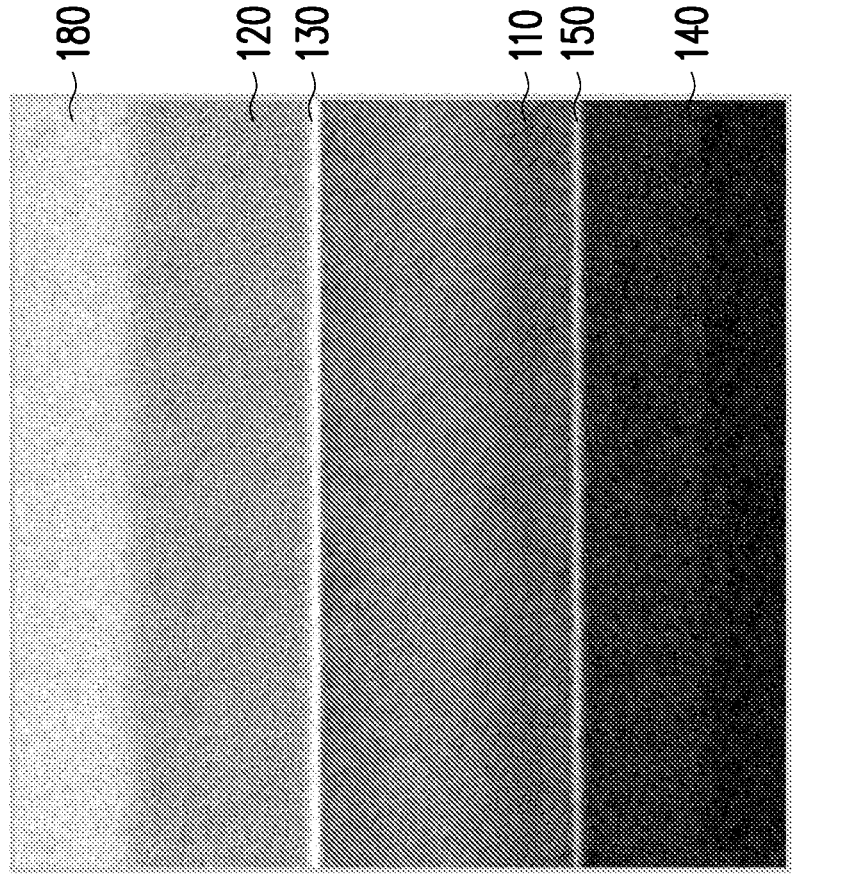
FIG. 2 is a partial transmission electron microscope (TEM) image of the epitaxial structure depicted in FIG. 1.

The interface treatment layer 130 contacts the first epitaxial layer 110 and the second epitaxial layer 120 and is located between the first epitaxial layer 110 and the second epitaxial layer 120. FIG. 2 is a partial transmission electron microscope (TEM) image of the epitaxial structure depicted in FIG. 1. With reference to FIG. 1 and FIG. 2, in an embodiment, the electron transmissivity of the interface treatment layer 130 to the TEM is greater than the electron transmissivity of the first epitaxial layer 110 and the second epitaxial layer 120 to the TEM. In a TEM image, the larger the electron transmissivity, the greater the image brightness (i.e., the whiter). In this embodiment, an image contrast ratio of the TEM of the interface treatment layer 130 to the first epitaxial layer 110 and an image contrast ratio of the TEM of the interface treatment layer 130 to the second epitaxial layer 120 are both greater than 1.005.

In this embodiment, the first epitaxial layer 110 and the second epitaxial layer 120 have the same doping type, e.g., n-type doping. In this embodiment, a material of the interface treatment layer 130 includes AlGaInP, and a concentration of the AlGaInP in the interface treatment layer 130 gradually increases from one side of the interface treatment layer 130 close to the first epitaxial layer 110 to the other side of the interface treatment layer 130 close to the second epitaxial layer 120. In this embodiment, elements of the first epitaxial layer 110, the interface treatment layer 130, and the second epitaxial layer 120 include gallium (Ga), and a concentration of Ga in the interface treatment layer 130 gradually decreases from the one side of the interface treatment layer 130 close to the first epitaxial layer 110 to the other side of the interface treatment layer 130 close to the second epitaxial layer 120.

In this embodiment, the epitaxial structure 100 further includes a third epitaxial layer 140 and another interface treatment layer 150. The third epitaxial layer 140 is disposed on one side of the first epitaxial layer 110 far from the second epitaxial layer 120. The interface treatment layer 150 is disposed between the first epitaxial layer 110 and the third epitaxial layer 140. Elements of the first epitaxial layer 110, the interface treatment layer 150, and the third epitaxial layer 140 include Ga, and a concentration of Ga in the interface treatment layer 150 is greater than a concentration of Ga in the third epitaxial layer 140. In an embodiment, the concentration of Ga in the interface treatment layer 150 gradually decreases from one side of the interface treatment layer 150 close to the first epitaxial layer 110 to the other side of the interface treatment layer 150 close to the third epitaxial layer 140.

In this embodiment, the epitaxial structure 100 further includes a substrate 160, a buffer layer 170, a spacer layer 180, an active layer 190, a spacer layer 210, a cladding layer 220, and a window layer 230. The buffer layer 170 is located on the substrate 160, the third epitaxial layer 140 is located on the buffer layer 170, the spacer layer 180 is disposed on the second epitaxial layer 120, the active layer 190 is located on the spacer layer 180, the spacer layer 210 is located on the active layer 190, the cladding layer 220 is located on the spacer layer 210, and the window layer 230 is located on the cladding layer 220.

In this embodiment, the substrate 160 is a growth substrate, such as a GaAs substrate. The buffer layer 170 is, for instance, a GaAs buffer layer. The third epitaxial layer 140 is, for instance, an etch stop layer. The first epitaxial layer 110 is, for instance, an n-type semiconductor contact layer. The second epitaxial layer 120 is, for instance, an n-type cladding layer. The spacer layer 180 is, for instance, an n-type spacer layer. The active layer 190 is a light emitting layer, such as a quantum well layer or a multiple quantum well (MQW) layer. The spacer layer 210 is, for instance, a p-type spacer layer. The cladding layer 220 is, for instance, a p-type cladding layer. The window layer 230 is, for instance, a p-type gallium phosphide window layer. In an embodiment, a chemical formula of the spacer layer 180, the active layer 190, the spacer layer 210, and the cladding layer 220 may be $(Al_xGa_{1-x})_{1-y}In_yP$, where $0 \leq x \leq 1$ and $0 < y < 1$; namely, the materials may be indium phosphide combined with aluminum, gallium, or aluminum and gallium. In some embodiments where the active layer 190 serves as the light emitting layer, a material of the active layer 190 may include gallium indium phosphide.

Figure 3:
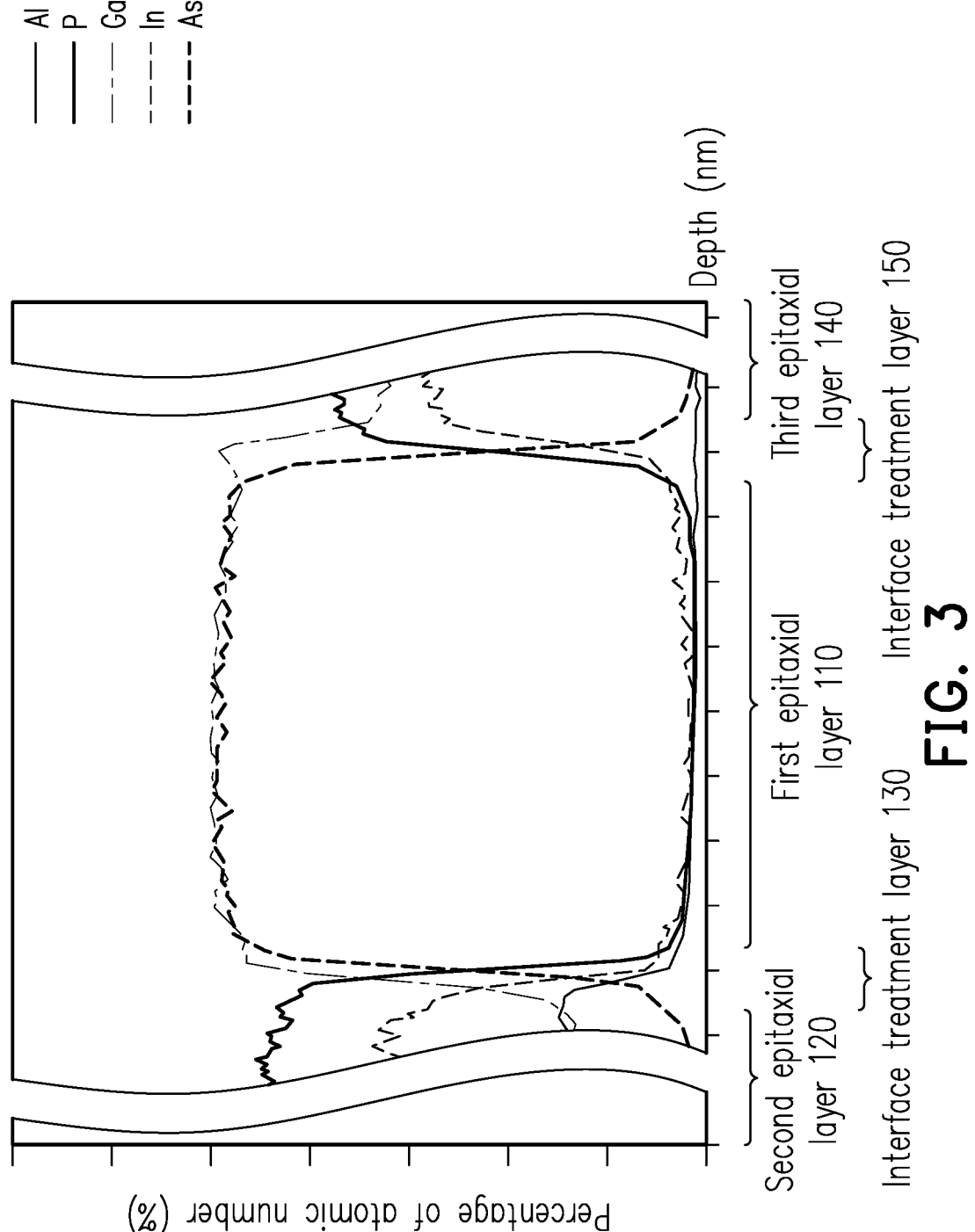
FIG. 3 is a distribution diagram illustrating a percentage of atomic number and a depth of each element in the epitaxial layer depicted in FIG. 1.

FIG. 3 is a distribution diagram illustrating a percentage of atomic number and a depth of each element in the epitaxial layer depicted in FIG. 1. With reference to FIG. 1 and FIG. 3, a concentration of a first group-III element in the interface treatment layer 130 gradually decreases from the one side of the interface treatment layer 130 close to the first epitaxial layer 110 to the other side of the interface treatment layer 130 close to the second epitaxial layer 120, and a concentration of a second group-III element and a concentration of a third group-III element in the interface treatment layer 130 gradually increase from the one side of the interface treatment layer 130 close to the first epitaxial layer 110 to the other side of the interface treatment layer 130 close to the second epitaxial layer 120, where an atomic number of the first group-III element is smaller than an atomic number of the second group-III element but greater than an atomic number of the third group-III element. In an embodiment, the first group-III element is gallium, the second group-III element is indium, and the third group-III element is aluminum.

In this embodiment, a concentration of a first group-V element in the interface treatment layer 130 gradually decreases from the one side of the interface treatment layer 130 close to the first epitaxial layer 110 to the other side of the interface treatment layer 130 close to the second epitaxial layer 120, and a concentration of a second group-V element in the interface treatment layer 130 gradually increases from the one side of the interface treatment layer 130 close to the first epitaxial layer 110 to the other side of the interface treatment layer 130 close to the second epitaxial layer 120, where an atomic number of the first group-V element is larger than an atomic number of the second group-V element. In an embodiment, the first group-V element is arsenic, and the second group-V element is phosphor. In this embodiment, a material of the first epitaxial layer 110 includes, for instance, GaAs, a material of the second epitaxial layer 120 includes, for instance, AlGaInP, and a material of the interface treatment layer 130 includes, for instance, AlGaInP.

On the opposite side of the interface treatment layer 130, a concentration of the first group-III element in the interface treatment layer 150 gradually increases from the other side of the interface treatment layer 150 close to the third epitaxial layer 140 to the one side of the interface treatment layer 150 close to the first epitaxial layer 110, and a concentration of the second group-III element in the interface treatment layer 150 gradually decreases from the other side of the interface treatment layer 150 close to the third epitaxial layer 140 to the one side of the interface treatment layer 150 close to the first epitaxial layer 110, where the atomic number of the first group-III element is smaller than the atomic number of the second group-III element. In an embodiment, the first group-III element is gallium, and the second group-III element is indium.

In this embodiment, a concentration of the first group-V element in the interface treatment layer 150 gradually increases from the other side of the interface treatment layer 150 close to the third epitaxial layer 140 to the one side of the interface treatment layer 150 close to the first epitaxial layer 110, and a concentration of the second group-V element in the interface treatment layer 150 gradually decreases from the other side of the interface treatment layer 150 close to the third epitaxial layer 140 to the one side of the interface treatment layer 150 close to the first epitaxial layer 110, where the atomic number of the first group-V element is greater than the atomic number of the second group-V element. In an embodiment, the first group-V element is arsenic, and the second group-V element is phosphor. In this embodiment, the material of the third epitaxial layer 140 is, for instance, gallium indium phosphide, the material of the first epitaxial layer 110 is, for instance, GaAs, and the material of the interface treatment layer 150 is, for instance, gallium indium phosphide.

FIG. 4 is a flowchart of a method for forming an epitaxial structure according to an embodiment of the disclosure. With reference to FIG. 1, FIG. 3, and FIG. 4, the method for forming an epitaxial structure provided in this embodiment may be applied to form the epitaxial structure 100 depicted in FIG. 1, and the method for forming the epitaxial structure may include following steps. First, step S110 is performed to provide the substrate 160. Next, step S120 is performed to form the buffer layer 170 on the substrate 160. Then, step S130 is performed to form the third epitaxial layer 140 on the buffer layer 170. After that, step S140 is performed to gradually change a proportion of a reactive carrier gas and form the interface treatment layer 150. Specifically, in this embodiment, when the interface treatment layer 150 is formed, a proportion of a carrier gas containing the first group-III element is gradually increased, and a proportion of a carrier gas containing the second group-III element is gradually reduced, where the atomic number of the first group-III element is smaller than the atomic number of the second group-III element. In an embodiment, the first group-III element is gallium, and the second group-III element is indium.

After that, a proportion of a carrier gas containing the first group-V element is gradually increased, and a proportion of a carrier gas containing the second group-V element is gradually reduced, where the atomic number of the first group-V element is larger than the atomic number of the second group-V element. In an embodiment, the first group-V element is arsenic, and the second group-V element is phosphor.

In this embodiment, the step of starting to gradually increase the proportion of the carrier gas containing the first group-III element and gradually decrease the proportion of the carrier gas containing the second group-III element may be performed earlier than the step of starting to gradually increase the proportion of the carrier gas containing the first group-V element and gradually decrease the proportion of the carrier gas containing the second group-V element.

In the interface treatment layer 150, due to the different time points at which the above-mentioned two concentrations of the carrier gases are changed, an average value of the atomic number of the interface treatment layer 150 as a whole may be changed twice in the above-mentioned process. Thereby, the proportions of various elements in the interface treatment layer 150 are different from those in the adjacent third epitaxial layer 140 and in the adjacent first epitaxial layer 110. Therefore, when the TEM is applied, it may be observed that the difference between the proportions of gallium and indium of the group-III element is greater than the difference between the proportions of phosphor and arsenic of the group-V element, where the observed image shows that the electron transmissivity is apparently increased. In other words, by gradually changing the proportion of the carrier gas in the epitaxial process according to this embodiment, deterioration of the epitaxial quality of the wafer resulting from simultaneously turning off all the carrier gases while switching between the steps may be prevented. Moreover, after the gradual adjustments described above, the interface treatment layer 150 is left inside the epitaxial structure 100.

After that, step S150 is performed to form the first epitaxial layer 110 on the interface treatment layer 150. After that, step S160 is performed to gradually change the proportion of the reactive carrier gas and form the interface treatment layer 130. Specifically, in this embodiment, when the interface treatment layer 130 is formed, the proportion of the carrier gas containing the first group-III element is gradually reduced, and the proportion of the carrier gas containing the second group-III element and the proportion of the carrier gas containing the third group-III element are gradually increased, where the atomic number of the first group-III element is smaller than the atomic number of the second group-III element but larger than the atomic number of the third group-III element. In an embodiment, the first group-III element is gallium, the second group-III element is indium, and the third group-III element is aluminum.

In this embodiment, when the interface treatment layer 130 is formed, the proportion of the carrier gas containing the first group-V element is gradually decreased, and the proportion of the carrier gas containing the second group-V element is gradually increased, where the atomic number of the first group-V element is larger than the atomic number of the second group-V element. In an embodiment, the first group-V element is arsenic, and the second group-V element is phosphor.

In this embodiment, when the interface treatment layer 130 is formed, the step of starting to gradually decrease the proportion of the carrier gas containing the first group-V element and gradually increase the proportion of the carrier gas containing the second group-V element may be performed earlier than the step of starting to gradually decrease the proportion of the carrier gas containing the first group-III element and gradually increase the proportion of the carrier gas containing the second group-III element and the proportion of the carrier gas containing the third group-III element. Similar to the average value of the atomic number in the above-mentioned interface treatment layer 150, due to the changes to the concentrations of the carrier gases, the average value of the atomic number in the interface treatment layer 130 is also changed, which leads to a relatively high electron transmissivity as shown in the TEM, which will not be reiterated hereinafter.

After that, step S170 is performed to form the second epitaxial layer 120 on the interface treatment layer 130. After that, step S180 is performed to form the spacer layer 180 on the second epitaxial layer 120. Step S190 is then performed to form the active layer 190 on the spacer layer 180. After that, step S210 is performed to form the spacer layer 210 on the active layer 190. Step S220 is then performed to form the cladding layer 220 on the spacer layer 210. Next, step S230 is performed to form the window layer 230 on the cladding layer 220.

In the method for forming the epitaxial structure and the epitaxial structure 100 provided in this embodiment, the interface treatment layer 130 or 150 is formed by gradually changing the proportion of the reactive carrier gas. Compared with the conventional epitaxial process in which the unnecessary gases are turned off at the same time, which causes the wafer to be baked at a high temperature in the reactive chamber and thus leads to the deterioration of the epitaxial quality, the method provided in this embodiment may be applied by gradually changing the proportion of the reactive carrier gas, so as to form the epitaxial structure with a favorable epitaxial quality. Under such circumstances, when the epitaxial structure 100 is observed by using the TEM, it may be learned that the electron transmissivity of the TEM to the interface treatment layer 130 to is greater than the electron transmissivity of the TEM to the first epitaxial layer 110 and to the second epitaxial layer 130, and the electron transmissivity of the TEM to the interface treatment layer 150 is greater than the electron transmissivity of the TEM to the first epitaxial layer 110 and the third epitaxial layer 140, whereby the favorable epitaxial quality of the epitaxial structure 100 may be guaranteed.

Figure 5:
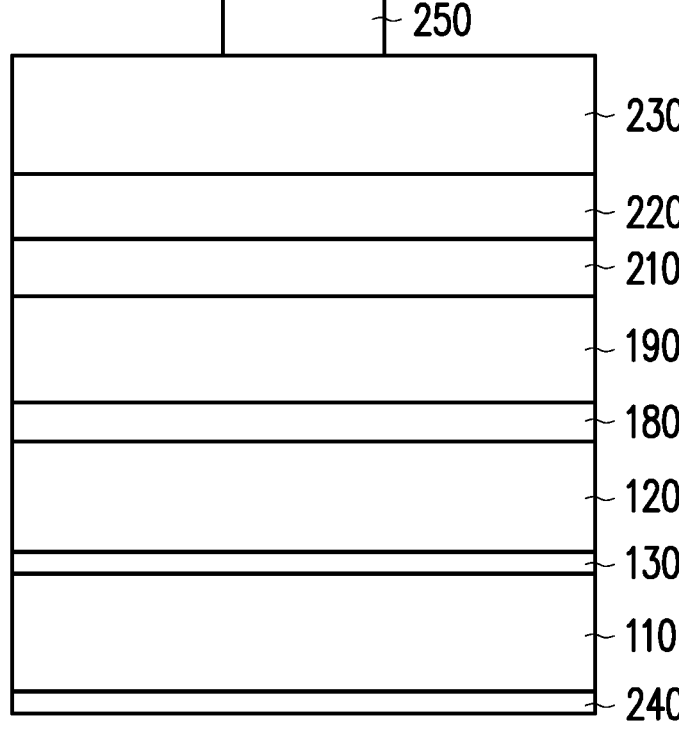
FIG. 5 is a schematic cross-sectional diagram of an epitaxial structure according to another embodiment of the disclosure.

FIG. 5 is a schematic cross-sectional diagram of an epitaxial structure according to another embodiment of the disclosure. With reference to FIG. 5, an epitaxial structure 100a depicted in FIG. 5 is, for instance, formed by performing some additional steps on the epitaxial structure 100 depicted in FIG. 1. For instance, after step S230 in FIG. 4, the substrate 160 and the buffer layer 170 may be removed by a laser, and the third epitaxial layer 140 and the interface treatment layer 150 may be further removed. Next, as shown in FIG. 5, an electrode 240 is formed on a surface of the first epitaxial layer 110 far from the second epitaxial layer 120, so as to generate an ohmic contact between the first epitaxial layer 110 and the electrode 240. In another aspect, an electrode 250 may be formed on the window layer 230, but the type of the electrodes 240 and 250 is not limited in the disclosure; according to different requirements, the electrode 240 and the electrode 250 may also have a flip chip structure. In other words, the initially formed interface treatment layer 150 may be removed based on subsequent needs; for instance, when the epitaxial structure 100a serves as a light emitting diode (LED) structure, only the second epitaxial layer 120 (e.g., an n-type doping cladding layer), the active layer 190, and the cladding layer 220 (e.g., a p-type doping layer) are necessary for the LED structure. At this time, the third epitaxial layer 140 may act as an etch stop layer, and the interface treatment layer 150 may be partially or completely etched and removed along with the third epitaxial layer 140 in the etching process.

To sum up, in the epitaxial structure provided in one or more embodiments of the disclosure, the interface treatment layer is arranged between the first epitaxial layer and the second epitaxial layer, and the image contrast ratio of the TEM of the interface treatment layer to the first epitaxial layer and the image contrast ratio of the TEM of the interface treatment layer to the second epitaxial layer are both greater than 1.005. Hence, the favorable epitaxial quality of the epitaxial structure may be guaranteed. Besides, in the method for forming the epitaxial structure provided in one or more embodiments of the disclosure, the interface treatment layer is formed by gradually changing the proportion of the reactive carrier gas. Compared to the conventional epitaxial process where the unnecessary gases are turned off at the same time, which causes the wafer to be baked at a high temperature in the reactive chamber and thus leads to the deterioration of the epitaxial quality, the method for forming the epitaxial structure provided herein is performed by gradually changing the proportion of the reactive carrier gas, so that the resultant epitaxial structure may have a favorable epitaxial quality.

Although the disclosure has been described with reference to the embodiments above, the embodiments are not intended to limit the disclosure. Any person skilled in the art may make some changes and modifications without departing from the spirit and scope of the disclosure. Therefore, the scope of the disclosure will be defined in the appended claims.

What is claimed is:

1. An epitaxial structure, comprising:

a first epitaxial layer, which is an ohmic contact layer;

a second epitaxial layer, disposed on the first epitaxial layer and being a phosphide compound layer, wherein a material of the second epitaxial layer is different from a material of the first epitaxial layer; and an interface treatment layer, contacting the first epitaxial layer and the second epitaxial layer and located between the first epitaxial layer and the second epitaxial layer, wherein an image contrast ratio of a transmission electron microscope of the interface treatment layer to the first epitaxial layer and an image contrast ratio of the transmission electron microscope of the interface treatment layer to the second epitaxial layer are both greater than 1.005, wherein a concentration of a first group-III element in the interface treatment layer gradually decreases from one side of the interface treatment layer close to the first epitaxial layer to the other side of the interface treatment layer close to the second epitaxial layer, wherein a concentration of a second group-III element and a concentration of a third group-III element in the interface treatment layer gradually increase from the one side of the interface treatment layer close to the first epitaxial layer to the other side of the interface treatment layer close to the second epitaxial layer, and an atomic number of the first group-III element is smaller than an atomic number of the second group-III element but larger than an atomic number of the third group-III element, and wherein a concentration of a first group-V element in the interface treatment layer gradually decreases from one side of the interface treatment layer close to the first epitaxial layer to the other side of the interface treatment layer close to the second epitaxial layer, and a concentration of a second group-V element in the interface treatment layer gradually increases from the one side of the interface treatment layer close to the first epitaxial layer to the other side of the interface treatment layer close to the second epitaxial layer, and an atomic number of the first group-V element is larger than an atomic number of the second group-V element.

2. The epitaxial structure according to claim 1, wherein an electron transmissivity of the interface treatment layer to the transmission electron microscope is greater than an electron transmissivity of the first epitaxial layer and an electron transmissivity of the second epitaxial layer to the transmission electron microscope.

3. The epitaxial structure according to claim 1, wherein the material of the second epitaxial layer comprises $(Al_xGa_{1-x})_yIn_{1-y}As_zP_{1-z}$, wherein $0 \leq x \leq 1$, $0 \leq y \leq 1$ and $0 \leq z < 1$.

4. The epitaxial structure according to claim 1, wherein a doping type of the first epitaxial layer is identical to a doping type of the second epitaxial layer.

5. The epitaxial structure according to claim 1, wherein the first group-III element is gallium, the second group-III element is indium, and the third group-III element is aluminum.

6. The epitaxial structure according to claim 1, wherein the first group-V element is arsenic, and the second group-V element is phosphor.

7. The epitaxial structure according to claim 1, wherein a material of the interface treatment layer comprises aluminum gallium indium phosphide, and a concentration of aluminum in the interface treatment layer gradually increases from one side of the interface treatment layer close to the first epitaxial layer to the other side of the interface treatment layer close to the second epitaxial layer.

8. The epitaxial structure according to claim 1, further comprising an electrode disposed on a surface of the first epitaxial layer far from the second epitaxial layer.

9. The epitaxial structure according to claim 1, wherein elements of the first epitaxial layer, the interface treatment layer, and the second epitaxial layer comprise gallium, and a concentration of the gallium in the interface treatment layer gradually decreases from one side of the interface treatment layer close to the first epitaxial layer to the other side of the interface treatment layer close to the second epitaxial layer.

10. The epitaxial structure according to claim 1, further comprising:

a third epitaxial layer, disposed on one side of the first epitaxial layer far from the second epitaxial layer; and another interface treatment layer, disposed between the first epitaxial layer and the third epitaxial layer, wherein elements of the first epitaxial layer, the another interface treatment layer, and the third epitaxial layer all comprise gallium, and a concentration of the gallium in the another interface treatment layer is greater than a concentration of the gallium in the third epitaxial layer.

11. The epitaxial structure according to claim 10, wherein the concentration of the gallium in the another interface treatment layer gradually decreases from one side of the another interface treatment layer close to the first epitaxial layer to the other side of the another interface treatment layer close to the third epitaxial layer.

12. A method for forming an epitaxial structure, the method comprising:

forming a first epitaxial layer, which is an ohmic contact layer;

gradually changing a proportion of a reactive carrier gas and forming an interface treatment layer; and forming a second epitaxial layer on the interface treatment layer, wherein the second epitaxial layer is a phosphide compound layer, and a material of the second epitaxial layer is different from a material of the first epitaxial layer, whereby forming the epitaxial structure comprising:

the first epitaxial layer;

the second epitaxial layer, disposed on the first epitaxial layer; and the interface treatment layer, contacting the first epitaxial layer and the second epitaxial layer and located between the first epitaxial layer and the second epitaxial layer, wherein an image contrast ratio of a transmission electron microscope of the interface treatment layer to the first epitaxial layer and an image contrast ratio of the transmission electron microscope of the interface treatment layer to the second epitaxial layer are both greater than 1.005, wherein a concentration of a first group-III element in the interface treatment layer gradually decreases from one side of the interface treatment layer close to the first epitaxial layer to the other side of the interface treatment layer close to the second epitaxial layer, wherein a concentration of a second group-III element and a concentration of a third group-III element in the interface treatment layer gradually increase from the one side of the interface treatment layer close to the first epitaxial layer to the other side of the interface treatment layer close to the second epitaxial layer, and an atomic number of the first group-III element is smaller than an atomic number of the second group-III element but larger than an atomic number of the third group-III element, and wherein a concentration of a first group-V element in the interface treatment layer gradually decreases from one side of the interface treatment layer close to the first epitaxial layer to the other side of the interface treatment layer close to the second epitaxial layer, and a concentration of a second group-V element in the interface treatment layer gradually increases from the one side of the interface treatment layer close to the first epitaxial layer to the other side of the interface treatment layer close to the second epitaxial layer, and an atomic number of the first group-V element is larger than an atomic number of the second group-V element.

13. The method for forming the epitaxial structure according to claim 12, in the step of forming the interface treatment layer, gradually reducing a proportion of a carrier gas containing the first group-III element and gradually increasing a proportion of a carrier gas containing the second group-III element and a proportion of a carrier gas containing the third group-III element.

14. The method for forming the epitaxial structure according to claim 13, in the step of forming the interface treatment layer, gradually reducing a proportion of a carrier gas containing the first group-V element and gradually increasing a proportion of a carrier gas containing the second group-V element.

15. The method for forming the epitaxial structure according to claim 14, in the step of forming the interface treatment layer, performing a step of starting to gradually reduce the proportion of the carrier gas containing the first group-V element and gradually increase the proportion of the carrier gas containing the second group-V element earlier than a step of starting to gradually reduce the proportion of the carrier gas containing the first group-III element and gradually increase the proportion of the carrier gas containing the second group-III element and the proportion of the carrier gas containing the third group-III element.

16. The method for forming the epitaxial structure according to claim 12, further comprising:

before forming the first epitaxial layer, sequentially forming an etch stop layer and another interface treatment layer, wherein the first epitaxial layer is formed on the another interface treatment layer.

17. The method for forming the epitaxial structure according to claim 16, in the step of forming the another interface treatment layer, gradually increasing a proportion of a carrier gas containing the first group-III element and gradually reducing a proportion of a carrier gas containing the second group-III element, wherein an atomic number of the first group III element is smaller than an atomic number of the second group-III element.

18. The method for forming the epitaxial structure according to claim 17, in the step of forming the another interface treatment layer, gradually increasing a proportion of a carrier gas containing the first group-V element and gradually reducing a proportion of a carrier gas containing the second group-V element.

19. The method for forming the epitaxial structure according to claim 18, wherein the step of starting to gradually increase the proportion of the carrier gas containing the first group-III element and gradually reduce the proportion of the carrier gas containing the second group-III element is performed earlier than the step of starting to gradually increase the proportion of the carrier gas containing the first group-V element and gradually reduce the proportion of the carrier gas containing the second group-V element.

* * * * *